United States Patent [19]

Tsunashima et al.

[11] Patent Number: 5,024,991

[45] Date of Patent: Jun. 18, 1991

[54] COMPOSITION USING SCHIFF BASE COPPER COMPLEX FOR PREPARING COMPOUND METAL OXIDES

[75] Inventors: Makoto Tsunashima, Tokyo; Hiroto Uchida, Omiya; Kazuhiro Sakai, Omiya; Masato Miyauchi, Omiya, all of Japan

[73] Assignee: Mitsubishi Kinzoku Kabushiki Kaisha, Tokyo, Japan

[21] Appl. No.: 226,999

[22] Filed: Aug. 1, 1988

[30] Foreign Application Priority Data

| Jul. 31, 1987 | [JP] | Japan | 62-190203 |
| Jul. 31, 1987 | [JP] | Japan | 62-190205 |
| Sep. 1, 1987 | [JP] | Japan | 62-216514 |
| Jan. 29, 1988 | [JP] | Japan | 63-17305 |

[51] Int. Cl.$^5$ .................. C01G 3/00; C04B 35/00; C23C 18/12; H01L 39/12
[52] U.S. Cl. ........................ 505/1; 252/521; 505/734
[58] Field of Search .................. 252/521; 505/1

[56] References Cited

U.S. PATENT DOCUMENTS

| 4,148,940 | 4/1979 | Breininger et al. | 427/226 |
| 4,485,094 | 11/1984 | Pebler et al. | 204/290 R |
| 4,719,127 | 1/1988 | Greenberg | 427/226 |

FOREIGN PATENT DOCUMENTS

| 60-115841 | 11/1983 | Japan . |
| 62-62507 | 3/1987 | Japan . |
| 62-143826 | 6/1987 | Japan . |
| 62-267476 | 11/1987 | Japan . |

OTHER PUBLICATIONS

Fahrenholtz et al., "Preparation of YBa$_2$Cu$_3$O$_7$–delta from Homog . . . ", Superconductor Symposium, Cincinnati, Ohio, U.S.A., 5/1/88, Energy ab #88(20) 162119.
Hirano et al., "Preparation of YBa$_2$Cu$_3$O$_{7-\delta}$ Superconductor . . . ", Chemistry Lett., 4/5/88, vol. No. 4, pp. 665–668.
Docuff et al., "The Gel Route to Chromium (3+) Doped . . . ", J. Non–Cryst. Solids, 89(1–2), pp. 84–97, Chem. Ab. #106(12):89090g.
Higuchi et al., "Synthesis and Properties of CO$^{2+}$–Ti$^{4+}$ . . . ", Adv. Ceramic Materials, vol. 3, No. 3, Mar. 1988, pp. 278–281.
Yamane et al., "Preparation of Bi–Sr–Ca–Cu–O Films . . . ", Chemistry Lett., 9/5/88, No. 9, pp. 1515–1516.
Kozuka et al., "Application of Sol–Gel Processing . . . ", Bull. Inst. Chem. Res., 66(2), pp. 80–92, Aug./88, CA #109(24) 214925y.
Guglielmi et al., "Precursors for Sol–Gel Preparations . . . ", J. Non–Cryst. Solids, 100(1–3), pp. 16–30, 1988, CA #108(26):225570j.
Yamane et al., "Formation of Bismuth Strontium Calcium . . . ", Jpn. J. Appl. Phys., part 2, 27(8) L1495–7, 1988, CA #110(6):49380c.
Accibal et al., "Comparison of Several Copper (I) and Copper (II) . . . ", Better Ceram. through Chem. III, 401–6, 4/8/88, CA #110(18):159030w.
Rice et al., "Preparation of Superconductory Thin Films of . . . ", High-Temperature Superconductors, 12/4/87, pp. 677–680.
Berry et al., "Formation of High T$_c$ Superconducting . . . ", Appl. Phys. Lett., 52(20), 5/16/88, pp. 1743–1745.
Materials and Processing Report, vol. 2, No. 10, 1/1988, pp. 6–7, "Organometalic Processing Route to Thin . . . ".

Primary Examiner—R. Dean
Assistant Examiner—David W. Schumaker
Attorney, Agent, or Firm—Oblon, Spivak, McClelland, Maier & Neustadt

[57] ABSTRACT

A composition for forming a compound metal oxide of a specific composition and a process for preparing said compound oxide are disclosed. The composition comprises an alkoxide of a rare earth metal, an alkoxide of an alkaline earth metal and an organic acid salt of an organic complex of copper. The process comprises refluxing said composition for reaction and thermally decomposing the reaction product. Also a film-forming composition for forming a thin layer of a compound metal oxide is disclosed. Said film-forming compound comprises the above-mentioned composition plus a film forming resin and an organic solvent.

4 Claims, No Drawings

COMPOSITION USING SCHIFF BASE COPPER COMPLEX FOR PREPARING COMPOUND METAL OXIDES

FIELD OF THE INVENTION

This invention relates to a composition and a process for preparing compound metal oxides. More specifically, this invention relates to composition and a process for preparing compound metal oxides which have specific compositions and are useful as superconductor materials, oxygen sensors, catalysts, etc. Especially, compound metal oxides of a rare earth metal, an alkaline earth metal and copper of specific compositions have recently drawn attention as superconductor materials which exhibit superconductivity at temperatures over 77 K.

BACKGROUND OF THE INVENTION

As methods for preparing compound metal oxides, there have been known processes in which (1) Oxides, carbonates or oxalates of the respective component metals are physically mixed in the state of powder, whereafter the mixture is fired and pulverized;

(2) Water-soluble salts such as nitrates of the respective component metals are dissolved in water to make a homogeneous solution, the metals are coprecipitated as insoluble hydroxide, carbonate, oxalates, etc. by addition of hydroxide ions, carbonate ions, oxalate ions, etc. the precipitate is collected and fired into a compound metal oxide, etc.

In process (1), powders are mixed and fired. Therefore, the reaction proceeds from the contact boundaries of the powder particles and there remain some unreacted portions. Thus the product often deviates in composition from the intended exact composition.

In process (2), the condition of precipitation differs from metal to metal. Therefore, a precipitate containing a rare earth metal, an alkaline earth metal and copper, for instance, in the content ratio exactly the same as the content ratio in the solution is not always formed. Therefore, a compound metal oxide of a composition different from that intended is inevitably formed.

The above-mentioned problems can be solved by heating for reaction a composition comprising an alkoxide of a rare earth metal, an alkoxide of an alkaline earth metal and an organic acid salt, a $\beta$-diketone complex, a $\beta$-ketoester complex or a Schiff base chelate complex of copper, optionally containing an organic solvent, and thermally decomposing the reaction product.

SUMMARY OF THE INVENTION

This invention provides a composition for preparing a compound oxides of a rare earth metal, an alkaline earth metal and copper in a specific content ratio, which contains:

(1) an alkoxide of a rare earth metal,
(2) an alkoxide of an alkaline earth metal, and
(3) an organic acid salt, a $\beta$-diketone complex, a $\beta$-ketoester, complex or a Schiff base chelate complex of copper in such content ratio that the amount of the rare earth metal in said alkoxide, the amount of the alkaline earth metal in said alkoxide and the amount of copper in said organic acid salt or complex correspond to the amounts of these metals in the object compound metal oxide, and further optionally containing (4) an organic solvent.

This invention also provides a process for preparing a compound metal oxide of a rare earth metal, an alkaline earth metal and copper in a specific content ratio, which comprises:

heating for reaction a composition which contains:
(1) an alkoxide of a rare earth metal,
(2) an alkoxide of an alkaline earth metal, and
(3) an organic acid salt, a $\beta$-diketone complex, a $\beta$-ketoester, complex or a Schiff base chelate complex of copper, in such content ratio that the amount of the rare earth metal in said alkoxide, the amount of the alkaline earth metal in said alkoxide and the amount of copper in said organic acid salt or complex correspond to the amounts of these metals in the object compound metal oxide, and optionally containing (4) an organic solvent;
thermally decomposing the formed reaction product.

Further, this invention provides a film-forming composition which is useful for forming thin film of the compound metal oxide. Said composition comprises the above-described composition to which a film-forming resin and an organic solvent are added.

In the present invention, the term "rare earth metal" means Sc, Y, La, Ce, Pr, Nd, Pm, Sm, Eu, Gd, Tb, Dy, Ho, Er, Tm, Yb and Lu.

In the present invention, the term "alkaline earth metal" means Be, Mg, Ca, Sr and Ba.

In the present invention, alkoxides of rare earth metals are represented by the formula $R(OR^1)(OR^2)(OR^3)$, wherein R stands for one rare earth metal, $R^1$ $R^2$ and $R^3$ are the same or different $C_1$-$C_6$ alkyl groups.

In the present invention, alkoxides of alkaline earth metals are represented by the formula $A(OR^1)(OR^2)$, wherein A stands for an alkaline earth metal and $R^1$ and $R^2$ are the same or different $C_1$-$C_6$ alkyl groups.

In the present invention, specific examples of the organic acid salts of copper are formate, propionate, acetate, citrate, gluconate, tartrate, oxalate, etc.

$\beta$-Diketone complexes and $\beta$-ketoester complexes of copper are represented by the formula $Cu(OR)_l(X)_m$, wherein R is a $C_1$-$C_6$ hydrocarbyl group, $l=0$ or 1; $m=1$ or 2 and $l+m=2$; and X stands for a group represented by the formula

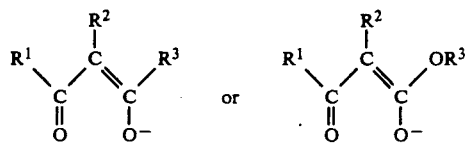

wherein $R^1$ and $R^2$ are respectively a $C_1$-$C_6$ hydrocarbyl group, and $R^3$ is a hydrogen atom or a $C_1$-$C_6$ hydrocarbyl group.

Schiff base chelate complexes of copper are represented by the formula

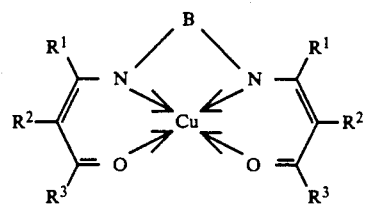

wherein $R^1$ and $R^3$ is $-CH_3$, $-C_2H_5$, $C_6H_5$ or $-CF_3$; $R^2$ is $-H$, $-CH_3$, $-C_2H_5$, $-C_6H_5$ or $-CF_3$; and B is $-(CH_2)_n-$, wherein n is 2, 3 or 4,

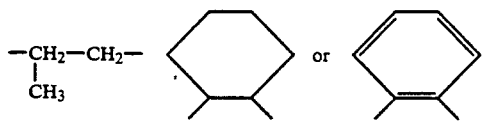

Of these copper complexes, Schiff base chelate complexes are most preferable, because the solubility thereof in organic solvents is highest and thus compound metal oxides of higher copper content can be prepared.

In the present invention, almost all organic solvents can be used if they dissolve the above-mentioned alkoxides, copper salts, and the above-mentioned copper complexes.

Specific examples of such solvents are esters such as ethyl acetate, ethyl propionate, etc.; alcohols such as methyl alcohol, ethyl alcohol, n- and iso-propyl alcohol, n-, iso- and tert-butyl alcohol, octyl alcohol; aliphatic saturated hydrocarbons such as pentane, cyclohexane, methylcyclohexane, etc.; aromatic hydrocarbons such as benzene, toluene, xylene, etc.; cycloethers such as tetrahydrofuran, dioxane, etc.; cellosolves such as methyl cellosolves, ethyl cellosolve, butyl cellosolve, etc.; formamides such as dimethylformamide, diethylformamide, etc.; sulfoxides such as dimethyl sulfoxide, diethyl sulfoxide, etc.; ketones such as acetone, methylethylketone, etc. The solvents can be used singly or in combination.

The solvent should preferably be well dried and free from carbon dioxide gas.

The composition of the present invention can be prepared by simply mixing the component compounds each in an predetermined amount usually together with a suitable amount of a suitable solvent. In order to assist dissolution of the components, the mixture can be heated, but the temperature should not exceed 100° C. to avoid decomposition or premature reaction of the components.

The process of the present invention is carried out as follows. The above composition is heated usually with a solvent added usually preferably at the reflux temperature. A small amount of water can be added so as to promote the reaction. It is not yet well understood what is formed by this reaction. However, it is sure that a precursor substance for the compound metal oxide is formed.

The thermal decomposition of this reaction product mixture is preferably conducted in the sprayed condition. For instance, the reaction product mixture can be sprayed into a heated quartz reaction tube through a pressure nozzle or a two-fluid nozzle. The reaction product mixture can be dropped onto a rapidly rotating disc and the formed fine drops are introduced into a high temperature reaction zone. Or, supersonic wave can be applied to the reaction product mixture so as to produce mist of the mixture, which is then introduced into a high temperature reaction zone. Thus the reaction product is thermally decomposed into the object compound oxide in the form of powder. Or, the reaction product mixture can be applied on the surface of a substrate and thermally decomposed. Thus a film of a compound metal oxide, a superconductive layer for instance, can be formed.

The thermal decomposition of said reaction product mixture requires a temperature not lower than 500° C. But on the other hand, it is preferred to carry out the decomposition at a temperature not higher than 1000° C. If the decomposition occurs at a temperature in excess of 1000° C., thermal decomposition starts from the surface of the drops and polymerization of oxide is incomplete and thus hollow particles are formed. At temperatures below 500° C., the thermal decomposition is insufficient and some reaction product remains although polymerization of the oxides proceeds.

As mentioned above, the reaction product mixture can be applied on the surface of a substrate and thermally decomposed to form a compound metal oxide. In this case, cellulosic polymers such as methyl cellulose, ethyl cellulose, nitro cellulose, ethylhydroxyethyl cellulose, etc. are preferred as film-forming resins. One or more of these resins are added to the composition of the present invention. Benzene, toluene, methyl cellosolve, ethyl cellosolve, etc. are preferred solvents.

SPECIFIC DISCLOSURE OF THE INVENTION

Now the invention will be explained by way of working examples and comparative examples.

EXAMPLE 1

Lanthanum triethoxide $La(OC_2H_5)_3$, strontium diethoxide $Sr(OC_2H_5)_2$ and copper acetyl acetonate $Cu(CH_3COCHCOCH_3)_2$ were dissolved in ethanol in a dried nitrogen atmosphere in a content ratio that the atomic ratio La:Sr:Cu was 1.8:0.2:1, and the solution was heated under refluxing for 4 hours. Thus a reaction product mixture was obtained. After the pH thereof was adjusted to 10.0–11.0 by addition of ammoniacal water diluted with pure water, and heating was continued to effect hydrolysis. A precipitate was formed and heating was continued further for 3 hours under refluxing. The precipitate was collected by centrifugation of 4000 rpm, and dried at 250° C. for 4 hours. The dried precipitate was fired in air at 1000° C. for 2 hours, the fired product was annealed at 900° C. for 3 hours and cooled in the furnace. Thus powder of the object compound metal oxide was obtained.

According to the X-ray diffraction analysis, the composition of the obtained powder was almost perfectly in accord with $La_{1.8}Sr_{0.2}CuO_{4-x}$, wherein x is a small fraction which represents deviation from the stoichiometric relation, and cannot be specified for the time being. This powder was pelletized and its superconductivity critical temperature (Tc) was measured and it was proved to be 40 K.

EXAMPLE 2

Yttrium triisopropoxide $Y[OCH(CH_3)_2]_3$, barium diisopropoxide $Ba[OCH(CH_3)_2]_2$ and copper methoxy acetyl acetonate $Cu(OCH_3)$ $(CH_3-COCHCOCH_3)$ were dissolved in anhydrous isopropyl alcohol in a dried nitrogen atmosphere in such content ratio that the atomic ratio Y:Ba:Cu is 1.2:0.8:1. The solution was heated under refluxing and a homogeneous stable composition for preparing a compound metal oxide was obtained. The pH of this liquid was adjusted to 10.0–11.0 by addition of ammonical water and hydrolysis was conducted by heating. After precipitate was formed, heating under refluxing was continued. The presipitate was collected by centrfugation of 4000 rpm, dried in a microwave oven for 30 minutes, and fired in air at 900° C. for 2 hours. The fired product was annealed at 900° C. for 4 hours and cooled in furnace. Thus the object compound metal oxide was obtained.

According to the X-ray diffraction analysis, the composition of the obtained powder was $Y_{1.2}Ba_{0.8}CuO_{4-x}$, which was entirely in accord with the intended composition. The powder was pelletized and superconductivity critical temperature (Tc) was measured and it was proved to be 100 K.

EXAMPLE 3–20 AND COMPARATIVE EXAMPLE 1-2

A plurality of compound metal oxides shown in Table 1 were prepared using starting materials indicated in the table by the same procedures as described above and superconductivity critical temperature was determined in the same manner. The results are shown in the same table.

EXAMPLE 21

Yttrium triisopropoxide $Y[OCH(CH_3)_2]_3$, barium diisopropoxide $Ba[OCH(CH_3)_2]_2$ and copper acetyl acetonate $Cu(CH_3COCHCOCH_3)_2$ were respectively dissolved in isopropanol so that the concentration was 0.035 mol/l. 100 ml, 200 ml and 300 ml of the respective solutions were taken and mixed and stirred sufficiently. The resulting solution was heated under refluxing for 4 hours.

The obtained reaction product mixture was sprayed into a quartz tube 90 mm in the inside diameter and 1 m in length which was heated at 700° C. through a nozzle of 0.4 mm diameter by blowing air in as a carrier gas at the rate of 10 l/min. Additional air was blown in as an auxiliary carrier gas at the rate of 6 l/min. Thus a compound metal oxide powder was obtained by thermal decomposition.

X-ray diffraction analysis of this powder revealed that the composition of the compound was $YBa_2$-

TABLE 1

| Ex. No. | Composition R | A | ratio | R.E.M.C. | A.E.M.C. | Cu Compound |
|---|---|---|---|---|---|---|
| Example | | | | | | |
| 1 | La- | $S_L$ | 1.8:0.2:1 | $La(OC_2H_5)_3$ | $Sr(OC_2H_5)_2$ | $Cu(AcAc)_2$ |
| 5 | " | " | 1.9:0.1:1 | $La(OC_3H_7)_3$ | $Sr(OC_3H_7)_2$ | $Cu(OCH_3)(AcAc)$ |
| 3 | Y | Ba | 0.3:0.7:1 | $Y(OC_3H_7)_3$ | $Ba(OC_2H_5)_2$ | $Cu(AcAc)_2$ |
| 4 | " | " | 0.4:0.6:1 | " | $Ba(OC_3H_7)_2$ | $Cu(CH_3COCHCOOC_2H_5)_2$ |
| 2 | " | " | 1.2:0.8:1 | " | " | $Cu(OC_2H_3)(AcAc)$ |
| 6 | " | " | 1:2:3 | $Y(OC_4H_9)_3$ | $Ba(OC_4H_9)_2$ | $Cu(OCH_3)(AcAc)$ |
| 7 | Tm | Ba | 0.3:0.7:1 | $Tm(OC_3H_7)_3$ | $Ba(OC_3H_7)_2$ | $Cu(C_3H_7CO_2)_2$ |
| 8 | " | " | 1.1:0.9:1 | " | $Ba(OC_2H_5)_2$ | $Cu(CH_3COCHCOOC_2H_5)_2$ |
| 9 | Er | " | 1.8:0.2:1 | $Er(OC_3H_7)_3$ | " | " |
| 10 | " | " | 0.3:0.7:1 | $Er(OC_4H_9)_3$ | $Ba(OC_4H_9)_2$ | $Cu(C_4H_9CO_2)_2$ |
| 11 | Ho | " | 1.3:0.7:1 | $H_3(OC_3H_7)_3$ | $Ba(OC_3H_7)_3$ | $Cu(AcAc)_2$ |
| 12 | " | " | 1:2:3 | " | " | $Cu(CH_3COCHCOOC_2H_5)_2$ |
| 13 | Dy | " | 1.2:0.8:1 | $Dy(OC_3H_7)_3$ | " | $Cu(AcAc)_2$ |
| 14 | " | " | 0.5:1.5:1 | " | $Ba(OC_2H_5)_2$ | $Cu(C_3H_7CO_2)_2$ |
| 15 | Yb | " | 0.3:0.7:1 | $Yb(OC_4H_9)_3$ | " | $Cu(AcAc)_2$ |
| 16 | " | " | 1.1:0.9:1 | " | " | " |
| 17 | Ce | Sr | 1.8:0.2:1 | $Ce(OC_3H_7)_3$ | $Sr(OEc)_2$ | $Cu(AcAc)_2$ |
| 18 | " | " | 1.85:0.15:1 | " | " | $Cu(C_3H_7CO_2)_2$ |
| 19 | Er | Sr | 1.8:0.2:1 | $Er(OC_3H_7)_3$ | " | " |
| 20 | " | " | 1.9:0.1:1 | " | " | $Cu(CH_3COCHCOOC_2H_5)_2$ |
| Comp. Ex. | | | | | | |
| 1 | Y | Ba | 0.3:0.7:1 | $Y_2(CO_3)_3$ | $BaCO_3$ | $CuO$ |
| 2 | " | " | 1.2:0.8:1 | $Y(CH_3CO_2)_3$ | $Ba(CH_3CO_2)_2$ | $Cu(CH_3CO_2)_2$ |

| Ex. No. | Solvent | Firing Temp. (°C.) | Time (hr) | Particle size of formed powder | Tc(K) |
|---|---|---|---|---|---|
| Example | | | | | |
| 1 | Isopropyl alcohol | 1000 | 2 | 600~1500 | 40 |
| 5 | Benzene | 950 | " | " | 42 |
| 3 | " | 990 | " | " | 105 |
| 4 | Isopropyl alcohol | " | " | " | 100 |
| 2 | " | " | " | " | 130 |
| 6 | Butyl alcohol | " | " | " | 110 |
| 7 | Isopropyl alcohol | " | " | " | 103 |
| 8 | Benzene | 980 | " | " | 96 |
| 9 | " | " | " | " | 43 |
| 10 | Butyl alcohol | " | " | " | 45 |
| 11 | Isopropyl alcohol | " | " | " | 93 |
| 12 | Benzene | " | " | " | 78 |
| 13 | " | " | " | " | 91 |
| 14 | Isopropyl alcohol | " | " | " | 82 |
| 15 | Toluene | " | " | " | 100 |
| 16 | Ethyl alcohol | " | " | " | 68 |
| 17 | Benzene | " | " | " | 35 |
| 18 | Isopropyl alcohol | " | " | " | 20 |
| 19 | " | " | " | " | 30 |
| 20 | Benzene | " | " | " | 31 |
| Comp. Ex. | | | | | |
| 1 | mixed as powder | 1000 | " | 2000 | 30 |
| 2 | Ethyl alc. + $H_2O$ | " | " | 700~1100 | 5 |

R.E.M.C. = Rare earth metal compound, A.E.M.C. = Alkaline earth metal compound.

$Cu_3O_{7-x}$, which was the same content ratio of the metals as that in the initial solution.

The obtained powder was observed under electron micrograph and was proved that the particle thereof is a secondary particle which is filled with primary particles having a diameter of 0.03 μm.

The powder was compacted into pellets and sintered at 900° C. for 2 hours, and the sintered pellets were annealed in an oxygen atmosphere at 850° C. for 10 hours and cooled slowly. The superconductivity critical temperature of this pellet was measured and it was revealed that this substance exhibits a constant value of Tc=110 K., and that the difference between the onset temperature and the end temperature was within 5 K.

Another portion of the above reaction product mixture was sprayed onto a hot plate heated at 500° C. through a double tube nozzle. The thermal decomposition product remained as powder on the hot plate was collected. Chemical analysis revealed that the composition of the powder was $YBa_2Cu_3O_{7-x}$.

EXAMPLE 22

Ytterbium triethoxide $Yb(OC_2H_5)_3$, barium diethoxide $Ba(OC_2H_5)_2$ and copper methoxy acetyl acetonate $Cu(OCH_3)(CH_3COCHCOCH_3)$ were respectively dissolved in ethanol so that the concentration was 0.035 mole/l. 100 ml, 300 ml and 400 ml of the respective solutions were taken and mixed and stirred sufficiently. The resulting solution was heated under refluxing for 3 hours. The reaction product mixture was treated in the same manner as in Example 1, and a homogeneous and stable compound metal oxide was obtained. Physical properties of the thus obtained compound metal oxide powder were measured. The composition was cofirmed to be $Yb_{0.25}Ba_{0.75}CuO_{3-x}$ by X-ray diffraction analysis.

It was revealed from electron micrograph observation that the powder comprises secondary particles each packed with 0.03 μm primary particles. Superconductivity critical temperature (Tc) was determined in the same manner as in Example 21 and it was 100 K. The difference between the onset temperature and the end temperature was within 5 K.

EXAMPLE 23

Thulium trimethoxide $Tm(OCH_3)_3$, strontium dimethoxide $Sr(OCH_3)_2$ and copper acetyl acetonate $Cu(CH_3COCHCOCH_3)_2$ were respectively dissolved in methanol so that the concentration was 0.035 mol/l. 300 ml, 100 ml and 200 ml of the respective solutions were taken and mixed and stirred sufficiently. The resulting solution was heated under refluxing for 4 hours. The reaction product mixture was treated in the same manner as in Example 21, and a homogeneous and stable compound metal oxide was obtained. Physical properties of the thus obtained compound metal oxide powder were measured. The composition was cofirmed to be $Tm_{1.5}Sr_{0.5}CuO_{3-x}$ by X-ray diffraction analysis.

It was revealed by electron micrograph observation that the powder comprises secondary particles each packed with 0.02 μm primary particles. Superconductivity critical temperature (Tc) was determined in the same manner as in Example 21 and it was 47 K. And the difference between the onset temperature and the end temperature was within 5 K.

EXAMPLE 24

Lanthanum triisopropoxide $La[OC(OCH_3)_2]_3$, strontium diisopropoxide $Sr[OC(CH_3)_2]_2$ and copper acetate $Cu(CH_3COO)_2$ were respectively dissolved in isopropanol so that the concentration was 0.035 mol/l. 300 ml, 100 ml and 200 ml of the respective solutions were taken and mixed and stirred sufficiently. The resulting solution was heated under refluxing for 4 hours. The reaction product mixture was treated in the same manner as in Example 21, and a homogeneous and stable compound metal oxide was obtained. Physical properties of the thus obtained compound metal oxide powder were measured. The composition was cofirmed to be $La_{1.5}Sr_{0.5}CuO_{3-x}$ by X-ray diffractometry.

It was revealed by electron micrograph observation that the powder comprises secondary particles each packed with 0.02 μm primary particles. Superconductivity critical temperature (Tc) was determined in the same manner as in Example 21, and it was 49 K. The difference between the onset temperature and the end temperature was within 5 K.

EXAMPLE 25

4.7 g of yttrium isopropoxide $Y[(OCH(CH_3)_2]_3$
8.9 g of barium isopropoxide $Ba[OCH(CH_3)_2]_2$ and
15.0 g of Schiff base chelate of copper

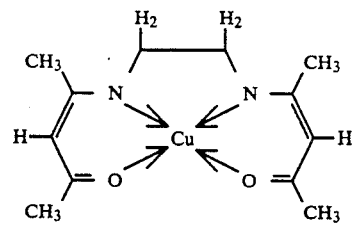

(atomic ratio of Y:Ba:Cu=1:2:3) were dissolved in 1 l of $CO_2$-free dried toluene by heating. To this solution 40 ml of ammonical water (pH 11) was added. A precipitate was formed. It was collected by centrifugation of 4000 rpm and fired at 1000° C. for 2 hours. The fired product was annealed at 900° C. for 3 hours and cooled in the furnace. Thus the object compound metal oxide was prepared. According to X-ray diffraction analysis, the composition of the obtained powder was $YBa_2Cu_3O_{7-x}$. The powder was pelletized and superconductivity critical temperature (Tc) was determined and it was 90 K.

EXAMPLE 26-29

Each combination of an yttrium alkoxide, a barium alkoxide, Schiff base chelate of copper and a solvent shown in Table 2 was homogeneously mixed into a solution and the solution was heated under refluxing. The resulting composition was sprayed onto a PSZ (partially stabilized zirconia) substrate plate heated at 500° C. so as to thermally decompose it and form a film of each compound metal oxide. The substrate with the film was heated at 800° C. in air for 3 hours. Thus coating layers of 0.5–2μ were formed. According to X-ray diffraction analysis, the formed coating film comprises more than 90% of $YBa_2Cu_3O_{7-x}$ superconductive phase. The superconductivity critical temperature (Tc) was determined and it was 80–90 K.

EXAMPLE 30 (REFERENCE)

12.0 g of copper acetyl acetonate $Cu(CH_3COCHCOCH_3)_2$ was added to 1 l of benzen solution containing:
4.0 g of yttrium isopropoxide $Y[OCH(CH_3)_2]_3$ and 7.8 g of barium isopropoxide Ba[OCH(CH₃)₂]₂, An insoluible precipitate was formed. It was revealed that the copper concentration could not be raised to higher than 3 g/l.

The obtained film-forming composition was printed on a zirconia substrate plate through a 250 mesh screen made of stainless steel screen with the resist film of 10 μm thickness and preliminarily dried at 150° C. for 20

TABLE 2

| Ex. No. | Y alcoxide 1 mol | Ba alcoxide 2 mol | Cu complex 3 mol | Solvent | Total conc. of metals (%) | Film thickness (μ) | Tc (K) | Remarks |
|---|---|---|---|---|---|---|---|---|
| 26 | Y[OCH(CH₃)₂]₃ | Ba[OCH(CH₃)₂]₂ | 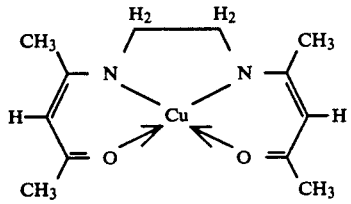 | Benzene | 0.9 | 1.5 | 90 | homogenous solution |
| 27 | Y(OC₄H₉)₃ | Ba(OC₄H₉)₂ | 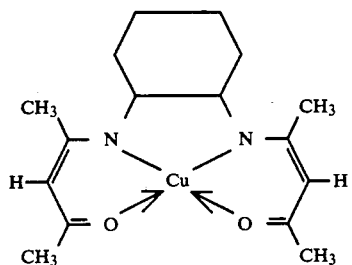 | Toluene | 0.8 | 1.1 | 87 | homogenous solution |
| 28 | Y[OCH(CH₃)₂]₃ | Ba[OCH(CH₃)₂]₂ | 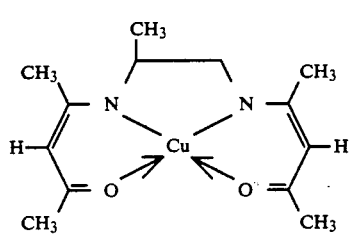 | Benzene | 1.0 | 1.3 | 88 | homogenous solution |
| 29 | Y[OCH(CH₃)₂]₃ | Ba[OCH(CH₃)₂]₂ | 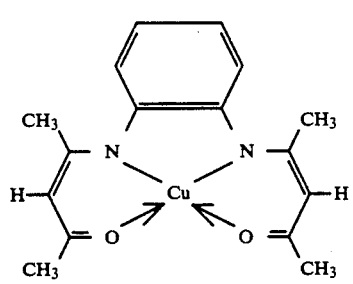 | Toluene | 1.0 | 1.0 | 87 | homogenous solution |
| 30 | Y[OCH(CH₃)₂]₃ | Ba[OCH(CH₃)₂]₂ | 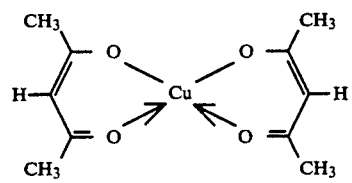 | Benzene | 0.7 | — | — | Precipitate formed |

EXAMPLE 31

Yttrium tri-n-butoxide Y(OC₄H₉)₃, barium di-n-butoxide Ba(OC₄H₉)₂ and copper butoxy acetyl acetonate Cu(OC₄H₉) (CH₃COCHCOCH₃) were dissolved in toluene in a molar ratio of 1:2:3 and the solution was heated under refluxing for 3 hours in a nitrogen atmosphere. Thereafater, ethyl cellulose was dissolved in the solution and thus a film-forming composition was obtained.

minutes and fired at 900° C. for 1 hour, and thus YBa₂Cu₃O₇₋ₓ film was formed. The superconductivity critical temperature (Tc) was determined by the four probe mthod. It was 92 K.

EXAMPLES 32-57, 59-60 AND COMPARATIVE EXAMPLES 3-7

By the same procedures as in Example 31, superconductive films were formed under the conditions indicated in Tables 3 and 4. The results are also indicated in the same tables. These films were very good in printability and homogenuity.

EXAMPLE 58

Yttrium tri-n-butoxide $Y(OC_4H_9)_3$, barium di-n-butoxide $Ba(OC_4H_9)_2$ and Cu acetyl acetonate $Cu(CH_3COCHCOCH_3)$ were dissolved in toluene in the molar ratio of 1:2:3 and the solution was heated under refluxing for 3 hours in a nitrogen atmosphere. Thereafter, ethyl cellulose was dissolved in the solution and thus a film-forming composition was obtained. An ink prepared with this film-forming composition was printed on a ziconia substrate plate using a 32 dot ink jet printer. A coating film of $YBa_2Cu_3O_{7-x}$ was formed. The superconductivity critical temperature (Tc) was determined by the four probe method and it was 92 K.

The results of Examples 31–60 and Comparative Examples 3-7 are also indicated in Tables 3 and 4.

In the evaluation of printability,
O means that no clogging of screen occurs;
Δ means that slight clogging of screen occurs; and
X means that clogging of screen occurs.
In the evaluation of film strength,
O means that no peeling-off occurs; and
Δ means that peeling-off occurs sometimes.
In the evaluation of smoothness,
O means smooth;
Δ means somewhat rough; and
X means remarkably rough.

TABLE 3

| No. | Composition RE | AE | x:y:z | Starting Materials RE Alkoxide | AE Alkoxide | Cu Compound | wt %* | Resin |
|---|---|---|---|---|---|---|---|---|
| Example | | | | | | | | |
| 31 | Y | Ba | 1:2:3 | $Y(OC_4H_9)_3$ | $Ba(OC_4H_9)_2$ | $Cu(OC_4H_9)(CH_3COCHCOCH_3)$ | 5 | Ethylcellulose |
| 32 | " | " | 0.3:0.7:1 | " | " | $Cu(CH_3COCHCOCH_3)_2$ | 5 | " |
| 33 | " | " | 1.2:0.8:1 | $Y(OC_3H_7)_3$ | $Ba(OC_3H_7)_2$ | $Cu(CH_3COCHCOOC_2H_5)_2$ | 6 | Methylcellulose |
| 34 | " | " | 1:2:3 | $Y(OC_4H_9)_3$ | " | $Cu(OCH_3)(CH_3COCHCOCH_3)$ | 7 | " |
| 35 | " | " | 1.2:0.8:1 | $Y(OC_5H_{11})_3$ | $Ba(OC_5H_{11})_2$ | $Cu(C_3H_7COO)_2$ | 9 | Ethylcellulose |
| 36 | " | " | 1:2:3 | $Y(OC_6H_{13})_3$ | $Ba(OC_6H_{13})_2$ | $Cu(C_7H_{15}COO)_3$ | 10 | Nitrocellulose |
| 37 | Tm | Ba | 1.1:0.9:1 | $Tm(OC_3H_7)_3$ | $Ba(OC_3H_7)_2$ | $Cu(OC_3H_7)(CH_3COCHCOCH_3)$ | 6 | Ethylcellulose |
| 38 | " | " | 0.3:0.7:1 | $Tm(OC_4H_9)_3$ | $Ba(OC_4H_9)_2$ | $Cu(CH_3COCHCOOC_2H_5)_2$ | 5 | " |
| 39 | " | " | 1:2:3 | $Tm(OC_5H_{11})_3$ | $Ba(OC_5H_{11})_2$ | $Cu(C_4H_9COO)_2$ | 8 | Methylcellulose |
| 40 | Er | Ba | 1.2:0.8:1 | $Er(OC_3H_7)_3$ | $Ba(OC_3H_7)_2$ | " | 8 | " |
| 41 | " | " | 1:2:3 | $Er(OC_4H_9)_3$ | $Ba(OC_4H_9)_2$ | $Cu(CH_3COCHCOCH_3)$ | 5 | Ethylcellulose |
| 42 | " | " | 0.3:0.7:1 | $Er(OC_6H_{13})_3$ | $Ba(OC_6H_{13})_2$ | $Cu(OC_3H_7)(CH_3COCHCOOC_2H_5)$ | 5 | " |
| 43 | Ho | Ba | 0.3:0.7:1 | $Ho(OC_3H_7)_3$ | $Ba(OC_3H_7)_2$ | $Cu(C_3H_7COO)_2$ | 7 | " |
| 44 | " | " | 1:2:3 | $Ho(OC_4H_9)_3$ | $Ba(OC_4H_9)_2$ | $Cu(OC_4H_9)(CH_3COCHCOCH_3)$ | 5 | " |
| 45 | " | " | 1.2:0.8:1 | $Ho(OC_7H_{15})_3$ | $Ba(OC_7H_{15})_2$ | $Cu(CH_3COCHCOCH_3)$ | 5 | " |
| 46 | Dy | Ba | " | $Dy(OC_3H_7)_3$ | $Ba(OC_3H_7)_2$ | $Cu(CH_3COCHCOOC_2H_5)_2$ | 5 | " |
| 47 | " | " | 1:2:3 | $Dy(OC_4H_9)_3$ | $Ba(OC_4H_9)_2$ | $Cu(OCH_3)(CH_3COCHCOCH_3)$ | 5 | " |
| 48 | " | " | 0.3:0.7:1 | $Dy(OC_8H_{17})_3$ | $Ba(OC_8H_{17})_2$ | $Cu(OC_5H_{11}COO)_2$ | 7 | " |
| 49 | Yb | Ba | " | $Dy(OC_3H_7)_3$ | $Ba(OC_3H_7)_2$ | $Cu(OC_7H_{15}COO)_2$ | 8 | " |
| 50 | " | " | 1.2:0.8:1 | $Yb(OC_4H_9)_3$ | $Ba(OC_4H_9)_2$ | $Cu(CH_3COCHCOCH_3)$ | 5 | " |
| 51 | " | " | 1:2:3 | $Yb(OC_5H_{11})_3$ | $Ba(OC_5H_{11})_2$ | $Cu(OC_4H_9)(CH_3COCHCOCH_3)$ | 5 | Methylcellulose |
| 52 | La | Sr | 1.8:0.2:1 | $La(OC_3H_7)_3$ | $Sr(OC_3H_7)_2$ | $Cu(CH_3COCHCOCH_3)_2$ | 5 | " |
| 53 | " | " | 1.9:0.1:1 | $La(OC_4H_9)_3$ | $Sr(OC_4H_9)_2$ | $Cu(OC_3H_7)(CH_3COCHCOCH_3)$ | 5 | Ethylcellulose |
| 54 | " | " | " | $La(OC_5H_{11})_3$ | $Sr(OC_5H_{11})_2$ | $Cu(C_4H_9COO)_2$ | 7 | " |
| 55 | Ce | Sr | 1.8:0.2:1 | $Ce(OC_3H_7)_3$ | $Sr(OC_3H_7)_3$ | $Cu(C_5H_{11}COO)_2$ | 7 | " |
| 56 | " | " | " | $Ce(OC_4H_9)_3$ | $Sr(OC_4H_9)_2$ | $Cu(CH_3COCHCOOC_2H_5)_2$ | 5 | " |
| 57 | " | " | 1.88:0.19:1 | $Ce(OC_5H_{11})_3$ | $Sr(OC_5H_{11})_2$ | $Cu(OC_2H_5)(CH_3COCHCOCH_3)$ | 5 | Methylcellulose |
| Comp. Ex. | | | | | | | | |
| 3 | Y | Ba | 1:2:3 | $YBa_2Cu_3(O)$ | Av. particle 2 μ | | 5 | Ethylcellulose |
| 4 | " | " | 1:2:3 | " | Av. particle 5 μ | | " | " |
| 5 | Ho | Ba | 1:2:3 | $YBa_2Cu_3(O)$ | Av. particle 5 μ | | " | Methylcellulose |

| No. | (wt %) | Solvent | (wt %) | Printability | Firing Temp./°C | Time/(hr) | Film Properties Strength | Smooth | Tc (K) |
|---|---|---|---|---|---|---|---|---|---|
| Example | | | | | | | | | |
| 31 | 10 | Benzene | 85 | o | 900 | 1 | o | o | 92 |
| 32 | " | Toluene | " | o | " | " | o | o | 93 |
| 33 | 9 | Methylcellosolve | 85 | o | " | " | o | o | 90 |
| 34 | 9 | " | 84 | o | " | 1.5 | o | o | 94 |
| 35 | 8 | Toluene | 83 | o | 920 | " | o | o | 90 |
| 36 | 10 | Ethylcellosolve | 80 | o | 950 | 1 | o | o | 92 |
| 37 | 9 | " | 85 | o | 920 | " | o | o | 85 |
| 38 | 10 | Toluene | 85 | o | " | " | o | o | 86 |
| 39 | 9 | Methylcellosolve | 83 | o | 950 | " | o | o | 86 |
| 40 | 9 | Toluene | 83 | o | " | 1.5 | o | o | 40 |
| 41 | 10 | Xylene | 85 | o | 900 | 1 | o | o | 42 |
| 42 | " | Ethylcellosolve | " | o | " | " | o | o | 40 |
| 43 | 9 | " | 84 | o | 910 | " | o | o | 86 |
| 44 | 10 | Toluene | 85 | o | " | " | o | o | 91 |
| 45 | " | Xylene | " | o | " | " | o | o | 84 |
| 46 | " | Methylcellosolve | " | o | 900 | " | o | o | 88 |
| 47 | " | Ethylcellosolve | " | o | " | " | o | o | 92 |
| 48 | 9 | Toluene | 84 | o | 950 | 1.5 | o | o | 91 |
| 49 | 9 | " | 83 | o | " | 1 | o | o | 90 |
| 50 | 10 | Xylene | 85 | o | 900 | " | o | o | 89 |
| 51 | " | Methylcellosolve | " | o | " | " | o | o | 93 |
| 52 | " | " | " | o | " | " | o | o | 40 |
| 53 | " | Toluene | " | o | " | " | o | o | 42 |
| 54 | 9 | Benzene | 84 | o | 950 | 1.5 | o | o | 39 |

TABLE 3-continued

| | | | | | | | | | |
|---|---|---|---|---|---|---|---|---|---|
| 55 | " | " | " | o | " | " | o | o | 35 |
| 56 | 10 | Toluene | 85 | o | 900 | " | o | o | 24 |
| 57 | " | Methylcellosolve | " | o | " | 1 | o | o | 26 |
| Comp. Ex. | | | | | | | | | |
| 3 | 10 | Ethylcellosolve | 85 | o | 900 | 1 | Δ | Δ | 90 |
| 4 | " | " | " | o | " | " | Δ | x | 93 |
| 5 | 10 | Methylcellosolve | " | o | " | " | Δ | x | 89 |

*Total weight percent of metals

TABLE 4

| | Composition | | | Starting Materials | | | | | |
|---|---|---|---|---|---|---|---|---|---|
| No. | RE | AE | x:y:z | RE Alkoxide | AE Alkoxide | Cu Compound | wt %* | Resin | (wt %) |
| Ex. | | | | | | | | | |
| 58 | Y | Ba | 1:2:3 | Y(OC$_4$H$_9$)$_3$ | Ba(OC$_4$H$_9$)$_2$ | Cu(CH$_3$COCHCOCH$_3$)$_2$ | 3 | Ethylcellulose | 7 |
| 59 | " | " | 1:2:3 | " | " | Cu(C$_3$H$_7$COO)$_2$ | 5 | " | " |
| 60 | Ho | " | 1:2:3 | Ho(OC$_4$H$_9$)$_3$ | " | " | 3 | " | " |
| C. E. | | | | | | | | | |
| 6 | Y | Ba | 1:2:3 | YBa$_2$Cu$_3$(O) | Av. particle 2μ | | 5 | " | " |
| 7 | " | " | " | " | Av. particle 5μ | | 5 | " | " |

| | | | | Print- | Firing | | Film Properties | | |
|---|---|---|---|---|---|---|---|---|---|
| | No. | Solvent | (wt %) | ability | Temp./°C. | Time/(hr) | Strength | Smooth | Tc(K) |
| Ex. | | | | | | | | | |
| | 58 | Toluene | 90 | o | 900 | 1 | o | o | 92 |
| | 59 | Ethylcellosolve | 88 | o | 920 | " | o | o | 93 |
| | 60 | Toluene | 90 | o | " | " | o | o | 85 |
| C. E. | | | | | | | | | |
| | 6 | " | 88 | Δ | " | " | Δ | x | 90 |
| | 7 | Ethylcellosolve | " | " | " | " | Δ | x | " |

*Total weight percent of metals

What is claimed is:

1. A composition for preparing a compound oxide of a rare earth metal, an alkaline earth metal and copper in a specific content ratio which comprises:
   (1) an alkoxide of a rare earth metal,
   (2) an alkoxide of an alkaline earth metal, and
   (3) a Schiff base chelate complex of copper,
in such content ratio that the amount of the rare earth metal in said alkoxide, the amount of the alkaline earth metal in said alkoxide and the amount of copper in said complex correspond to the amounts of these metals in the object compound metal oxide.

2. A composition as recited in claim 1, wherein said Schiff base chelate complex of copper has the formula

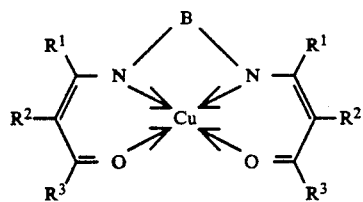

wherein $R^1$ and $R^3$ are —CH$_3$, —C$_2$H$_5$, —C$_6$H$_5$ or —CF$_3$; $R^2$ is —H, —CH$_3$, —C$_2$H$_5$, —C$_6$H$_5$ or —CF$_3$; and B is —(CH$_2$)$_n$—, wherein n is 2, 3 or 4,

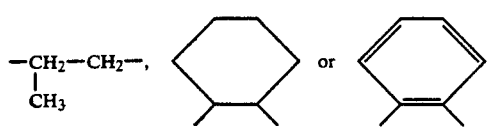

3. A film-forming composition for forming a thin film of the compound metal oxide comprising
   (1) an alkoxide of a rare earth metal,
   (2) an alkoxide of an alkaline earth metal, and
   (3) a Schiff base chelate complex of copper,
in such content ratio that the amount of the rare earth metal in said alkoxide, the amount of the alkaline earth metal in said alkoxide and the amount of copper in said complex correspond to the amounts of these metals in the object compound metal oxide,
   (4) a film-forming resin, and
   (5) an organic solvent.

4. A film-forming composition as recited in claim 3, wherein said Schiff base chelate complex of copper has the formula

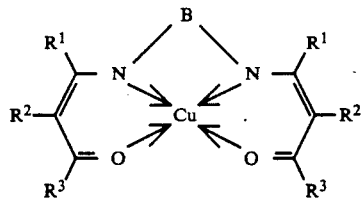

wherein $R^1$ and $R^3$ are —CH$_3$, —C$_2$H$_5$, —C$_6$H$_5$ or —CF$_3$; $R^2$ is —H, —CH$_3$, —C$_2$H$_5$, —C$_6$H$_5$ or —CF$_3$; and B is —(CH$_2$)$_n$—, wherein n is 2, 3 or 4,

* * * * *